United States Patent
Godyak

(10) Patent No.: US 10,083,817 B1
(45) Date of Patent: Sep. 25, 2018

(54) LINEAR REMOTE PLASMA SOURCE

(71) Applicant: Valery Godyak, Brookline, MA (US)

(72) Inventor: Valery Godyak, Brookline, MA (US)

( * ) Notice: Subject to any disclaimer, the term of this patent is extended or adjusted under 35 U.S.C. 154(b) by 1174 days.

(21) Appl. No.: 13/759,032

(22) Filed: Feb. 4, 2013

Related U.S. Application Data

(63) Continuation-in-part of application No. 11/843,595, filed on Aug. 22, 2007, now Pat. No. 8,920,600.

(60) Provisional application No. 61/594,822, filed on Feb. 3, 2012, provisional application No. 60/839,011, filed on Aug. 22, 2006.

(51) Int. Cl.
| | | |
|---|---|---|
| C23C 16/00 | (2006.01) |
| C23F 1/00 | (2006.01) |
| H01L 21/306 | (2006.01) |
| H01J 37/32 | (2006.01) |
| H01S 3/097 | (2006.01) |
| H05H 1/24 | (2006.01) |

(52) U.S. Cl.
CPC ...... H01J 37/3211 (2013.01); H01S 3/09702 (2013.01); H05H 1/2406 (2013.01)

(58) Field of Classification Search
CPC .............. H01J 37/321; H01J 37/3211; H01J 37/32119; H01S 3/09702; H05H 1/2406; H05H 2001/4652; H05H 2001/466; H05H 2001/4697
USPC ........ 118/723 I, 723 IR; 156/345.48, 345.49; 315/111.51
See application file for complete search history.

(56) References Cited

U.S. PATENT DOCUMENTS

| | | | | |
|---|---|---|---|---|
| 5,619,103 A * | 4/1997 | Tobin | ............... | H01J 37/321 |
| | | | | 204/298.08 |
| 6,051,073 A * | 4/2000 | Chu | ............... | H01J 37/321 |
| | | | | 118/723 E |
| 6,422,172 B1 * | 7/2002 | Tanaka | ............... | C23C 16/505 |
| | | | | 118/723 E |
| 2004/0060517 A1 * | 4/2004 | Vukovic | ............... | H01J 37/321 |
| | | | | 118/723 I |
| 2004/0247522 A1 * | 12/2004 | Mills | ............... | B01J 19/088 |
| | | | | 423/648.1 |
| 2006/0108945 A1 * | 5/2006 | Chandler | ............... | H05B 41/24 |
| | | | | 315/248 |
| 2007/0024201 A1 * | 2/2007 | Lee | ............... | H01J 27/024 |
| | | | | 315/111.91 |

(Continued)

FOREIGN PATENT DOCUMENTS

WO  WO2011/032592  *  3/2011

*Primary Examiner* — Rakesh Dhingra
(74) *Attorney, Agent, or Firm* — Daniel L. Flamm; Microtechnology Law & Analysis

(57) ABSTRACT

Methods and apparatus for improved inductively coupled plasma sources are disclosed. A remote linear plasma source can have a plurality of coil segments operable to power intense localized radiofrequency plasma current channels along inner surfaces of a chamber. A plurality of localized intense plasma current channels within a single chamber provides a relatively large active plasma volume, improves efficiency, and provides for favorable residence time and feed gas distribution in a plasma source. In various embodiments, a remote plasma source operable to generate active species is useful for applications such as chamber cleaning, processing materials, ion, electron, and/or neutral beam sources, gaseous discharge lamps, fluorescent lighting, gaseous lasers, and others.

20 Claims, 13 Drawing Sheets

(56) References Cited

U.S. PATENT DOCUMENTS

2012/0188871 A1\* 7/2012 Liu ..................... H04L 12/413
370/230

\* cited by examiner

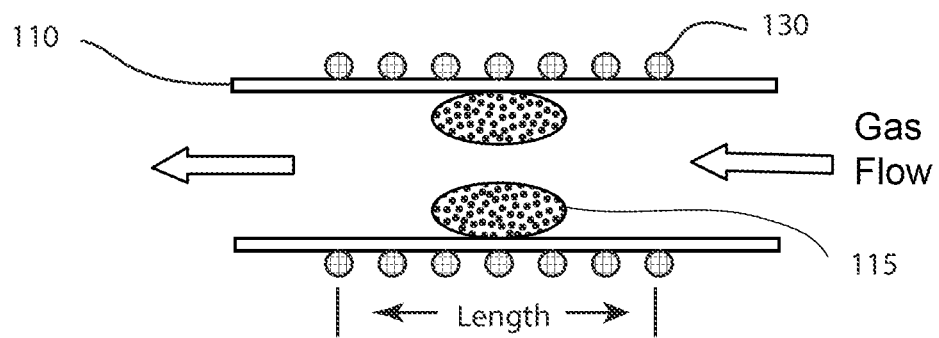
FIG. 1A (Side View)
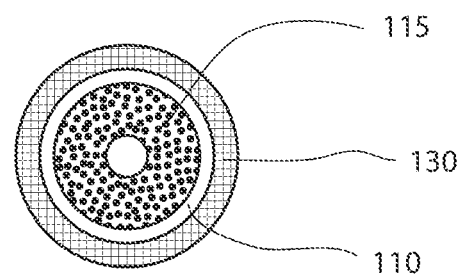
FIG. 1B (End View)
PRIOR ART

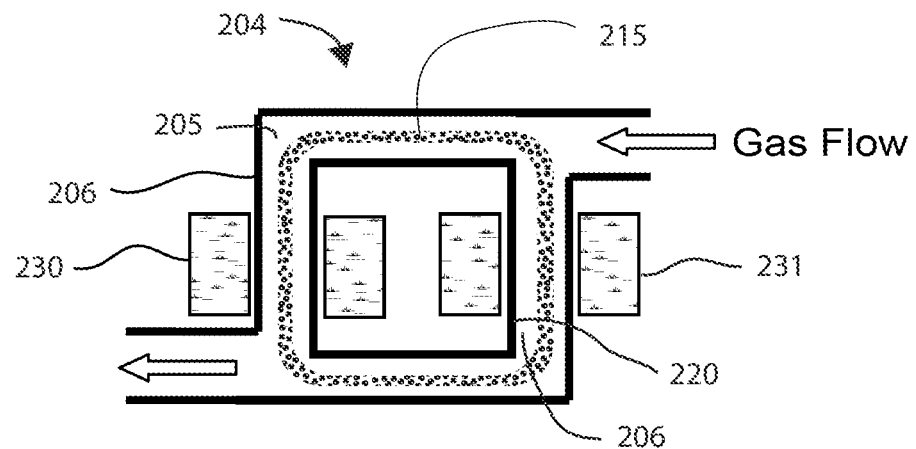
FIG. 2A
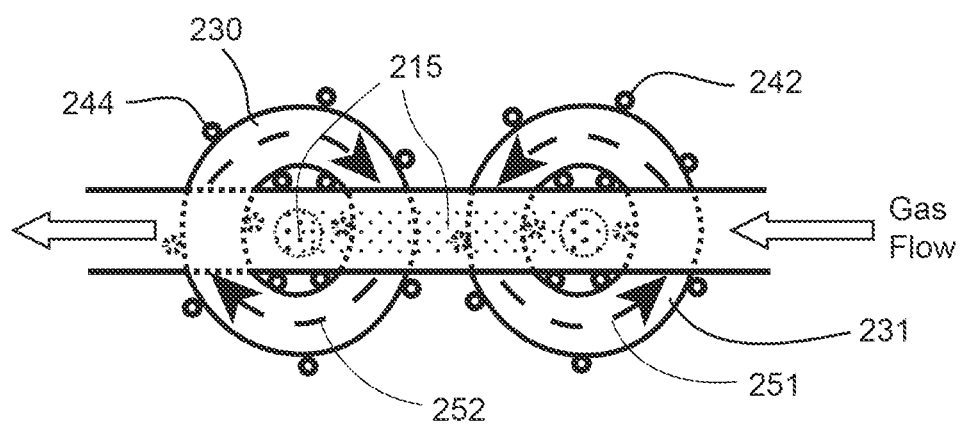
FIG. 2B (Top View)

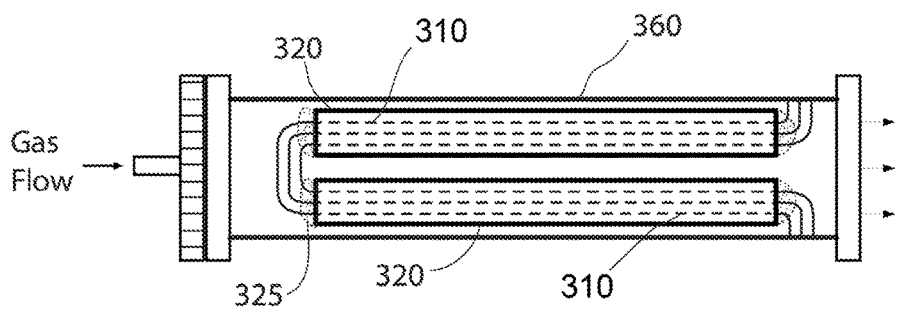
FIG. 3A (Front)
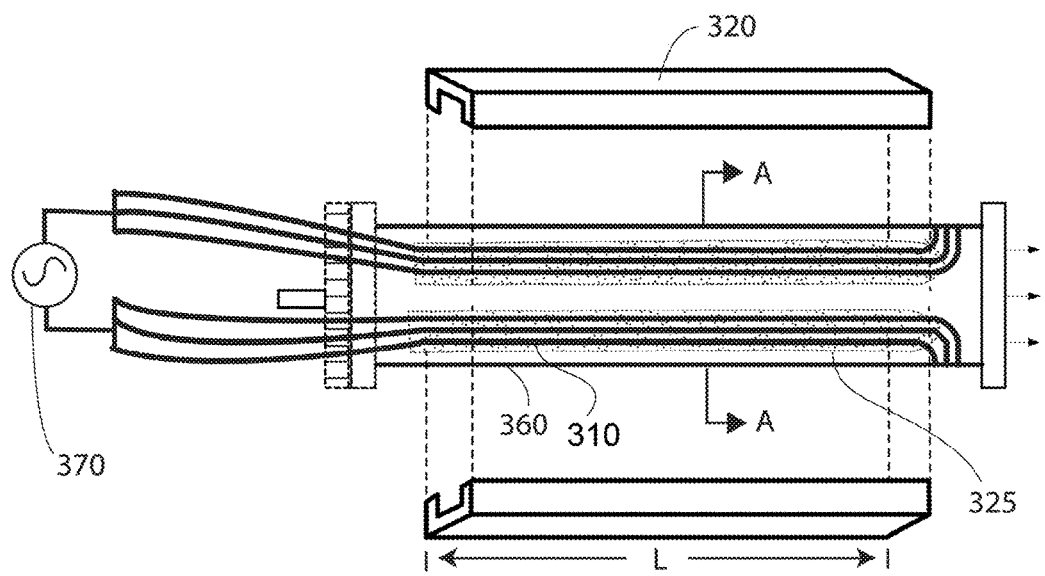
FIG. 3B (Rear)
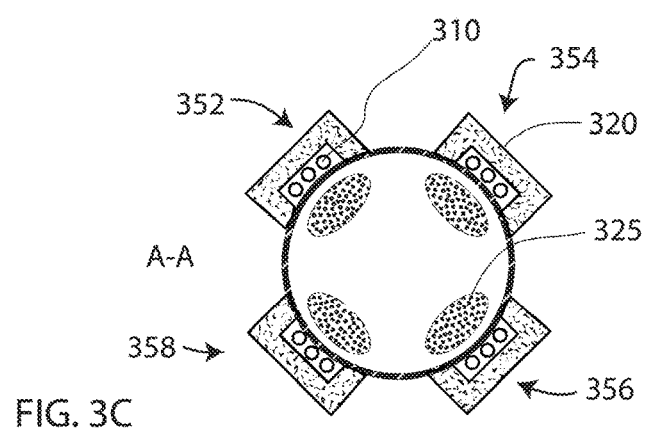
FIG. 3C

ya US 10,083,817 B1 … (content)

LINEAR REMOTE PLASMA SOURCE

CROSS REFERENCE TO RELATED APPLICATIONS

The present application is related to and claims priority from U.S. Provisional Patent Application Ser. No. 61/594,822 filed on Feb. 3, 2012, and is a continuation-in-part of U.S. patent application Ser. No. 11/843,595 filed on Aug. 22, 2007 which claims priority from U.S. Provisional Patent Application Ser. No. 60/839,011 filed on Aug. 22, 2006, each of which is hereby incorporated by reference in its entirety.

FIELD OF THE INVENTION

The present invention relates to methods and apparatus for plasma generation and more particularly to a remote plasma source having a plurality of inductively coupled plasma current paths.

BACKGROUND

Disclosed methods and apparatus generally relate to inductive remote plasma sources for applications such as treating surfaces, device fabrication, treatment of materials and products, lighting, and others. Furthermore, inductive plasmas disclosed herein can be useful sources of chemically active species, charged particles such as ions or/and electrons, charged and/or neutral species in excited states, and sources of coherent and/or incoherent ultraviolet, visible, and/or infrared radiation. Various embodiments are useful for processing substrates downstream of the plasma source, cleaning plasma processing chambers, manufacturing semiconductor devices, illumination, laser excitation, and others.

The terms "remote plasma source" and "remote plasma processing" generally relate to plasma generation apparatus and plasma treatment methods (e.g. device processing, surface treatment, plasma cleaning) in which plasma generation and treatment/processing with entities are effectuated in distinct spatially segregated regions (e.g. a treatment/processing position is separated from the plasma generation region).

Inductively coupled plasmas (ICP) for generating active species for cleaning chambers and remote plasma processing have been maintained using apparatus comprising an inductive applicator operable to couple high frequency power into a plasma within a chamber (the plasma source chamber). The applicator can be external to the chamber and isolated from the plasma environment.

In the prior art, a single external helical coil wound on a tubular quartz or ceramic chamber has been useful to sustain an inductive plasma discharges to generate active species in applications such as remote plasma cleaning, surface treatment, resist ashing, etching, chemical vapor deposition, gas discharge lighting, and gas lasers. Depending on the application, active plasma species useful for processing can be neutral radicals, excited states of various atomic and/or molecular entities, and/or charged particles such as electrons and ions.

In a number of applications remote plasma processing has been preferred. A remote plasma apparatus has spatially segregated plasma generation and treatment regions. A plasma can be generated in a plasma source chamber and species emanating from the plasma source. and/or secondary species arising from the emanated species, can be transported downstream to a distinct ("remote") region for processing. In this manner, exposure to unwanted and/or harmful agents inherent in a plasma generation region, such as current, heat, charging current, short wavelength radiation (ultraviolet, x-ray, etc.) and others can be selectively attenuated, or even eliminated from the processing region. Remote processing can be performed in a discrete chamber, and/or in a conduit downstream of the plasma generation chamber, depending on the application.

Various process feed gases can be admitted to the plasma generation (source) chamber to produce active species. For example, a feed can comprise elemental gases such as helium, argon, chlorine, bromine, hydrogen, oxygen, nitrogen and others, and compound molecular gases such as fluorocarbons, chlorocarbons, silanes, water vapor, ammonia, and others. Furthermore, additional feed gas can be admitted downstream from a remote plasma source to produce secondary species arising from reaction between the additional feed and species emanating from the remote plasma. In embodiments, a gas can be evacuated from a chamber with pumping means such as a roots blower, a mechanical pump, a turbomolecular pump, and/or others, in single or in combination.

Various prior art ICP remote plasma sources can be understood with respect to in FIGS. 1A, 1B, 2A, and 2B. FIGS. 1A-1B show a general prior art inductively coupled remote plasma source embodiment. The embodiment comprises a cylindrical tube ("chamber") in which an inductively coupled plasma can be sustained. A helical coil 130 wound around the tube can be energized with a radiofrequency power source (not shown). Typically, high frequency voltage from the power source is applied to the coil and drives current through the coil. The high frequency current flow can induce high frequency magnetic flux lines in the tube, generally directed along its axis (axially). This axial time-dependent flux can actuate a circumferential radiofrequency plasma discharge current circulating in a torus 115 within the tube (FIGS. 1A-1B).

The straight passage of a prior art tubular inductively coupled remote plasma source such as shown in FIGS. 1A-1B, presents a relatively low resistance to gas flow. However, the active plasma channel in this configuration is often susceptible to radial and axial plasma constriction, particularly at relatively high pressure and/or power levels. Even in normal operation, a majority of active plasma current is contained within a toroidal donut-like region 115 close to tube wall 110, as shown in FIGS. 1A-1B. Furthermore, the axial extent of this donut-shaped region (dimension along the direction of the tube) is generally limited to the order of a tube radius, is relatively independent of the coil length. Therefore, increasing the amount of active plasma volume in this configuration has been problematic.

Another inductively coupled remote plasma source embodiment described in U.S. Pat. No. 6,150,628 by Smith et al. can be understood with respect to FIGS. 2A and 2B. Exemplary embodiments with respect to FIGS. 2A and 2B comprise a chamber 204 having at least two parallel connected tubular flow passages 205, 206 (vertical left and right channels shown in FIG. 2A). Ferromagnetic elements 230, 231 encircle each of the respective parallel flow passages. As can be seen with respect to the transverse cross section in FIG. 2B, coils 242, 244 can be wound on the respective ferromagnetic elements 230 and 231 (the coils are not shown in the simplified vertical cross section FIG. 2A). Each coil is operable to receive high frequency current from a power source to induce a circulating high frequency magnetic flux 252, 251 in the respective core (230, 231). The magnetic flux circulation around each flow passage in turn induces an electromotive force (EMF) directed along the axis of a respective passage.

The direction of induced EMF depends on the sense of current flow in the coil and resultant sense of magnetic flux circulation (e.g. counterclockwise flux circulation 251 provides positive EMF emerging from the plane of the figure and clockwise circulation provides EMF having the opposite sense). The relative phase of the coil currents is selected to provide an EMF in each flow passages 180 degrees out of phase with respect to other. Accordingly, the EMF's are in a serial relationship, and can drive active plasma current 215 in a closed loop through the flow passages.

Embodiments with respect to FIGS. 2A-2B are often susceptible to radial plasma constriction. In radial plasma constriction, the width of the active current carrying plasma path shrinks to a narrow, relatively small fraction of the inner tube (chamber) diameter. Correspondingly, substantial amounts of feed gas can bypass the active region and receive little or no excitation. It has been found that increasing the fluid passage diameter (e.g. using a larger tube/chamber cross section) has relatively little effect on the active plasma radius (e.g. the portion of the tube cross section conducting induced current which activates the plasma generally shows little change). Accordingly, it has been difficult to increase the scale of active species production in these sources.

Remote inductively coupled plasma sources such as shown in FIGS. 1A, 1B, 2A and 2B, are often operated in a relatively high range of gas pressure (0.1-10 Torr or more) and relatively high radiofrequency power (1 KW and above). Under these conditions, a steady state unconstricted plasma mode can be unstable with respect to constriction.

As can be seen, there is a longstanding need for inductively remote plasma sources that can be scalable to provide relatively larger and stable active plasma volumes and/or higher power levels, and have simple construction.

SUMMARY

Various embodiments of a novel inductively coupled linear remote plasma source (LPS) are disclosed. These embodiments provide a plurality of separate high intensity plasma current channels that can be scaled in length or in number relative to the volume of a plasma source to provide a suitable plasma density. The disclosed LPS plasma sources are simple to construct, provide high processing throughput, and are relatively energy efficient. The disclosed embodiments are particularly useful in remote plasma source (RPS) applications to provide high throughput and high energy efficiency.

Various LPS embodiments are useful for plasma treatment and cleaning of articles, and chamber cleaning. LPS ion, electron, and neutral beam sources, efficient lamps and lasers are also disclosed.

One aspect of the invention is a method of processing a substrate in the manufacture of a device. The method comprises placing a substrate having a film thereon on a substrate holder within a processing chamber of a processing apparatus and admitting a process gas into the interior of the chamber.

A linear plasma source operable to power a plurality of distinct active current channels to produce active species and/or electromagnetic radiation in a chamber is disclosed. The linear plasma source comprises a plurality of distinct elongated antenna segments external to the chamber. Each of these antenna segments is disposed adjacent to an area of dielectric window in a chamber wall, which is transparent to radiofrequency magnetic flux. This plurality of distinct intense plasma current channels is operable to sustain plasma in the plasma source chamber and provide active species and/or electromagnetic radiation emanating from the plasma source chamber.

Each of the distinct elongated antenna segments has a coil segment. The antenna segments are disposed such that the coil segment is over a respective window area in the chamber wall. Each antenna segment also includes a magnetic flux concentrator having a transverse cross section of magnetically permeable material covering the coil segment. The magnetic concentrators are generally concave in a direction facing the respective window area, and have laterally disposed extremities extending toward the chamber interior up to the external surface of the each window area; The antenna segments are operable to receive radiofrequency power from a radiofrequency power source and induce radiofrequency magnetic flux lines emanating directionally from a first extremity of the magnetic flux concentrator, into the chamber through the adjacent dielectric windows. The magnetic flux lines return directionally through the window from the chamber, and to a second extremity of the magnetic flux concentrator.

The magnetic flux lines emanating from each respective distinct antenna segment are operable to induce a distinct corresponding intense plasma current channel in the chamber near the inner surface of the dielectric window. Each intense plasma current channel in the chamber is proximate to the inner surface of a dielectric window area under the applicator and situated laterally between the first and other extremities of the magnetic flux concentrator adjoining the outside of the window. Each plasma current channel is oriented in a direction generally parallel to the adjacent dielectric window under the respective antenna segment, and perpendicular to the emanating magnetic flux.

In various embodiments, the elongated antenna segments and intense plasma current channels are approximately parallel to one another. There also are embodiments where the cross section of the magnetic flux concentrator has a general shape selected from among a U, an E, and a C.

In yet further embodiments, a linear plasma source comprises an extracting and accelerating structure for extracting charged particles from the plasma in a beam. In some of these embodiments the wall of the chamber comprises an electrically conductive material and the charged particles comprise ions. Also, some embodiments comprise an electron accelerating electrode and a direct current voltage source operable to maintain the electron accelerating electrode at a positive potential relative to the plasma, wherein the wall of the chamber comprises electrically conductive material and the charged particles comprise electrons.

Various other embodiments are useful as a gas discharge laser where plasma in the chamber comprises an active laser medium. In these embodiments the linear plasma source includes opposing optical windows in the wall of the chamber and at least two focusing mirrors.

In some embodiments a linear plasma source is operable as a gas discharge lamp. The plasma is operable to produce light and the chamber comprises a highly transparent wall area operable to transmit light. A number of these embodiments are operable as a fluorescent lamp. In a fluorescent lamp embodiment, the interior surface of the highly transparent wall area has a phosphor coating. The plasma is operable to produce ultraviolet light which can be absorbed by the phosphor coating and converted into fluorescent light emission in the visible spectrum. Visible fluorescent light emission from the phosphor coating can emanate through a transparent wall area of the chamber.

In various fluorescent light embodiments, the plasma source chamber is sealed with amounts of argon and mercury inside. The mercury can be elemental and/or in the form of an amalgam. The amalgam can provide a mercury vapor partial pressure in the range of 5-10 mTorr to the chamber during operation and the plasma source can be operable to heat the amalgam to a selected temperature in the range of 70-90° C.

Moreover, embodiments of a linear source comprising a treatment region spatially segregated from the plasma generation chamber are disclosed. In these embodiments, the plasma source is operable treat an article disposed in the treatment region with a process depending on species emanating from the plasma generation chamber.

BRIEF DESCRIPTION OF DRAWINGS

Various embodiments are illustrated in an exemplary manner by the accompanying drawings. The drawings and accompanying description should be understood to explain principles of the embodiments rather than be limiting. Other embodiments will become apparent from the description and the drawings.

FIG. 1A shows a simplified longitudinal cross-section of a prior art linear plasma source.

FIG. 1B shows a radial cross-section of the prior art linear plasma source in FIG. 1A.

FIG. 2A shows a simplified side-cross sectional view of another prior art ICP remote plasma source.

FIG. 2B shows a simplified top cross-sectional view of the prior art plasma source in FIG. 2A.

FIG. 3A shows a simplified frontal diagram of an RPS according to the present disclosure.

FIG. 3B is a simplified rear view diagram of the RPS of FIG. 3A. showing a power source 370 electrically connected to an inductive plasma applicator coil.

FIG. 3C shows a cross sectional view along A-A of FIG. 3B.

DETAILED DESCRIPTION

Figure 4:
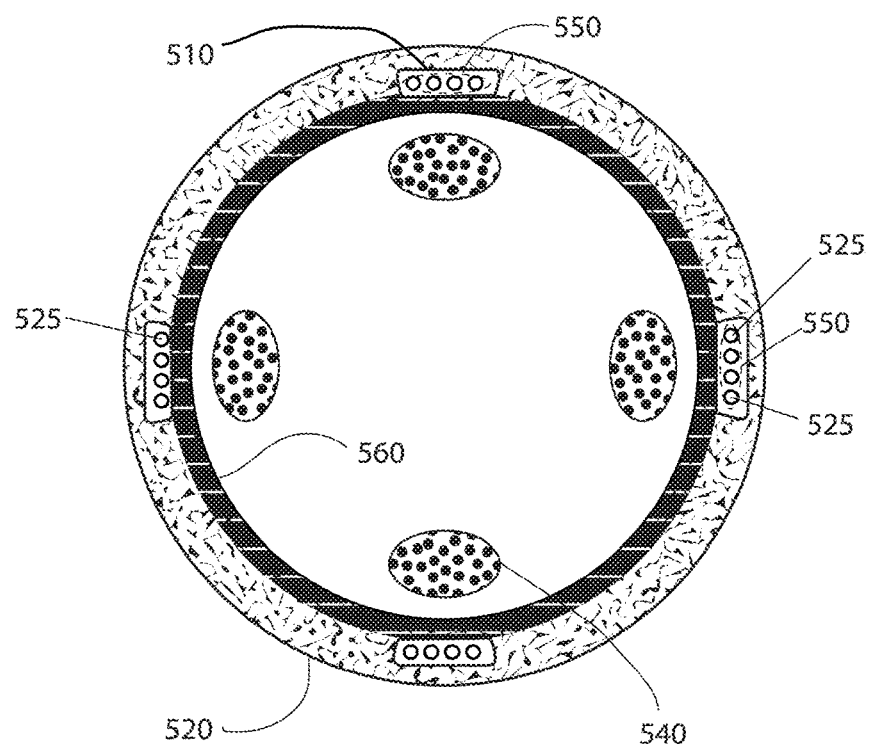
FIG. 4 shows a simplified transverse view of a further RPS comprising a unitary focus element assembly surrounding a tubular vacuum chamber.

The terminology herein is for the purpose of describing particular embodiments and is not intended to be limiting of the invention. It will be understood that, although the terms first, second, etc. may be used to describe various elements, these terms are only used to distinguish one element from another and the elements should not be limited by these terms. For example, a first element could be termed a second element, and similarly a second element could be termed a first element, without departing from the scope of the instant description. As used herein, the singular forms "a", "an" and "the" are intended to include the plural forms as well, unless the context clearly indicates otherwise. It will be further understood that the terms "comprises," "comprising," "includes," "including," and/or "having," as used herein, are open-ended terms of art that signify the presence of stated features, integers, steps, operations, elements, and/or components, but do not preclude the presence or addition of one or more other features, integers, steps, operations, elements, components, and/or groups thereof. Reference in the specification to "one embodiment", "an embodiment", or some embodiment, etc. means that a particular feature, structure, or characteristic described in connection with the embodiment is included in at least one embodiment. The appearances of the phrase "in one embodiment" in various places in the specification are not necessarily all referring to the same embodiment, nor are separate or alternative embodiments mutually exclusive of other embodiments.

The term module refers to a distinct unit that is operable to perform an identifiable function. A module can be a self-contained physical unit or piece of equipment. A module can also be a logical component effectuated by a processor and tangible media having instructions and/or data that are operable for the processor to perform the identifiable function. The term automatic refers to a module, service, or control system that is operable to perform with no human interaction.

The term gas or gas phase species as used herein includes species not bound to each other that have thermal and/or directed motion, and is not limited by a mean free path between collisions. Hence the term includes atomic or molecular beams, species in a vacuum, and the like.

The terms high frequency and radiofrequency, as used herein, refer to an oscillation frequency in the range of approximately 50 kHz to 1 GHz. Hence the term includes electromagnetic waves having very long wavelengths in air as well as those having centimeter wavelengths. The term applicator refers to a device for coupling radiofrequency electromagnetic energy into a plasma. An applicator can comprise inductive elements such as coils, capacitance coupled to a plasma, and/or means for launching a propagating electromagnetic wave. An inductive applicator refers to an applicator that is operable to couple energy to a plasma predominantly with a time-varying magnetic field.

An inductive applicator can emit high frequency magnetic flux through a dielectric chamber wall into the plasma generation chamber and receive returning magnetic flux (e.g. a dielectric wall of a chamber can serve as a relatively transparent "window" through which magnetic flux from an applicator can circulate through the chamber) High frequency magnetic flux lines circulating through the chamber can induce relatively intense plasma current through space in the chamber surrounded by the flux lines.

As used here, various terms denoting spatial position such as above, below, upper, lower, leftmost, rightmost and the like are to be understood in a relative sense. The various aspects of the apparatuses described herein are operable without regard to the spatial orientation of the apparatuses as a whole. For example, an apparatus can be configured in a vertical orientation or in a horizontal orientation. Hence a component or module that is described as being above another component or module in a first embodiment having a first orientation, could equivalently be described as being to the left of the other component or module in an equivalent second embodiment configured to be in a second orientation 90 degrees counterclockwise with respect to the first.

An inverted U-shaped cross section refers to a cross section that has a substantially continuous top joining with two approximately lateral sides having approximately equal length (e.g. having the general shape of the letter "U"). This term will be understood to include cross sections such as those through an inverted glass or cup, as well as the cross section of a rotationally symmetric recess cut into one side of a plate. In some aspects, this type of cross section can also be referenced as a C-shaped cross section. An E-shaped cross section refers to a cross section that has a substantially continuous top joining with two lateral side-legs and a central leg (e.g. having the general shape of an "E").

The present teachings may be embodied in various different forms. In the following description, for purposes of explanation, numerous specific details are set forth in the description and drawings in order to provide a thorough understanding of the various principles. Furthermore, in various instances, structures and devices are described and/ or drawn in simplified form in order to avoid obscuring the concepts. However, it will be apparent to one skilled in the art that the principles can be practiced in various different forms without these specific details. Hence aspects of the disclosure should not be construed as being limited to the embodiments set forth herein.

A number of embodiments of the RPS can be understood with respect to FIG. 3A-3C. In an embodiment with respect to FIGS. 3A-3C, an inductive applicator comprises four antenna segments 352, 354, 356, 358 disposed adjacent to a dielectric wall portion of a chamber 360. Each antenna segment can be parallel to an axis of the chamber, such as the central axis of a cylindrical chamber as shown with respect to FIGS. 3A-3B. The antenna segments can be disposed equidistant around the chamber periphery, and each segment is operable to power a distinct intense plasma current channel 325 situated in the chamber immediate below the antenna. As is shown, each of the antenna segments can comprise an elongated U-shaped focusing element 320 having permeable ferromagnetic material. Each focusing element can cover a number of generally parallel conductors 310 collectively referenced as a "coil segment. A coil segment is disposed within the transverse cross section of an inverted U-shaped magnetic focusing element The parallel coil conductors in the coil segment within an antenna segment, such as shown with respect to FIGS. 3A-3C, can be electrically connected in series with corresponding conductors in other coil segments thereby forming an entire coil. Each of the interconnected coil segments of the entire coil can be combined in an undulating path starting from a first end of the coil, twice traversing the elongated dielectric wall of the chamber, and terminating at a second end of the coil. As is apparent from FIGS. 3A-3C, current flows in opposite directions (antiphase) through the parallel coil conductors in adjacent antenna segments. The first ends of the conductors in a coil can be connected in parallel to one output terminal of a power source 370, and the second ends of the coil conductors can be connected to the other terminal of the power source. Accordingly, RF power can be coupled to the entire inductive applicator through the two terminal ends of the four serially connected antenna segments shown with respect to the simplified diagrams of FIGS. 3A-3C. In further embodiments a greater or smaller number of antenna segments can be used to energize a respectively greater or smaller number of distinct intense plasma current channels, and antenna segments can be disposed on a chamber wall in various different geometrical configurations.

Figure 12A:
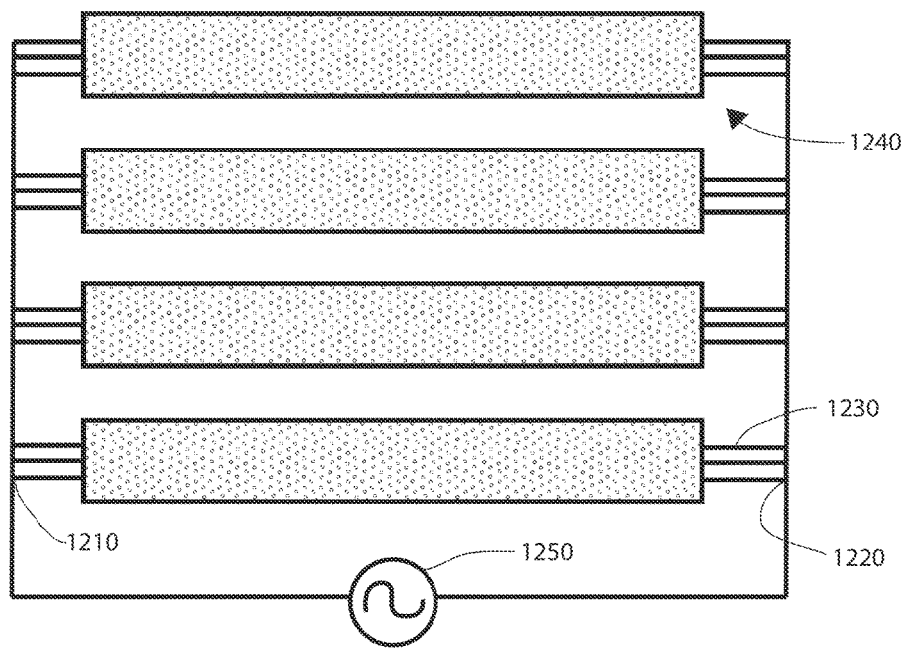
FIG. 12A is a simplified diagram showing antenna segments in a parallel electrical connection to a power source.
Figure 12B:
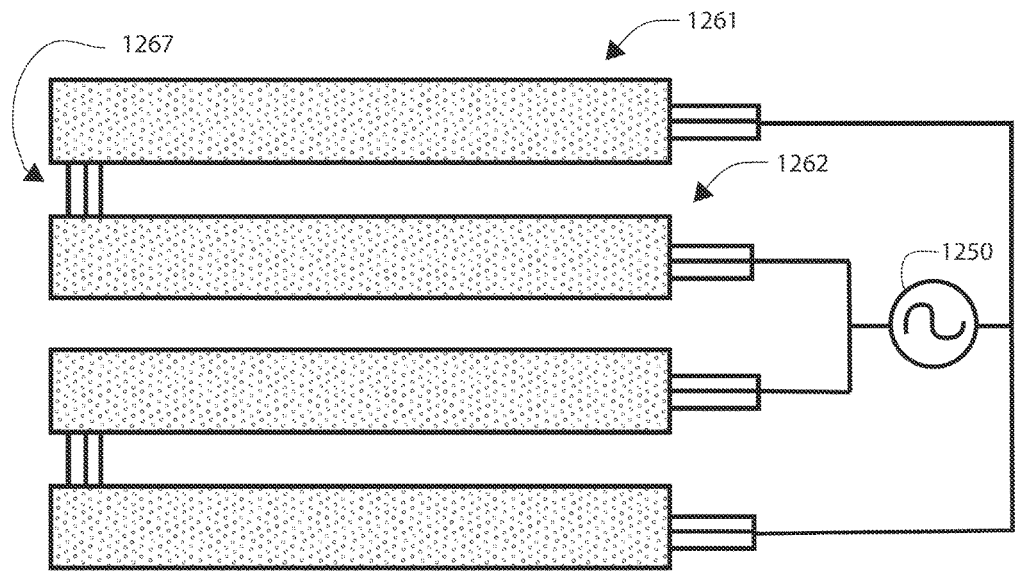
FIG. 12B is a simplified diagram showing antenna segments in a serial/parallel electrical connection to a power source.

In further embodiments various antenna segments can be interconnected in a parallel and/or series parallel manner. For example, in embodiments with respect to FIG. 12A, the first 1210 and second ends 1220 of each conductor 1230 in the various antenna segments 1240 can be connected in parallel to the respective first and second terminals of a power source 1250 (e.g. power is applied in parallel to the antenna segments). In further embodiments with respect to FIG. 12B, the individual coil segment conductors in a plurality of antenna segments such as 1261, 1262 can be interconnected in series with a radiofrequency power source 1250. In some of these embodiments, each group of serially connected segments (e.g. 1261 and 1262; 1263 and 1264 with respect to FIG. 12B) can be connected in parallel with another group to the first and second terminals of a high frequency power source 1250 (e.g. "series-parallel" connection). These various configurations of connections are merely exemplary and do not limit the scope or geometry of the coil segment interconnections. For example, although three straight parallel conductors are shown in the simplified embodiments with respect to FIGS. 12A and 12B, various individual coil segments can have larger or smaller numbers of generally parallel conductors, depending on the embodiment.

Furthermore, it is found that performance is relatively insensitive to nonuniformity in the spacing between conductors and/or degree of parallelism between the conductors in an antenna segment. Although an interconnection 1267 between different antenna segments can be made via corresponding individual conductors as shown at the left of the simplified diagram in FIG. 12B, a single conductor can interconnection can be used (e.g. the conductors in an antenna segment can be connected in parallel to a single conductor interconnection) at one or both ends, depending on the embodiment.

Figure 9A:
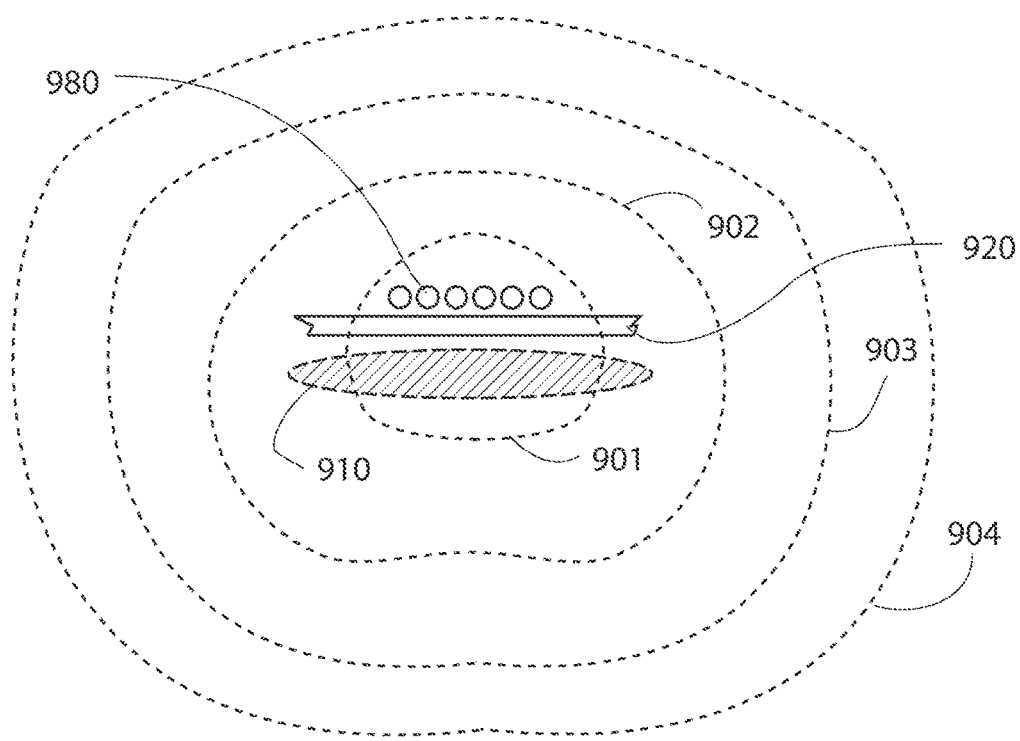
FIG. 9A shows magnetic field lines surrounding a flat coil segment.
Figure 9B:
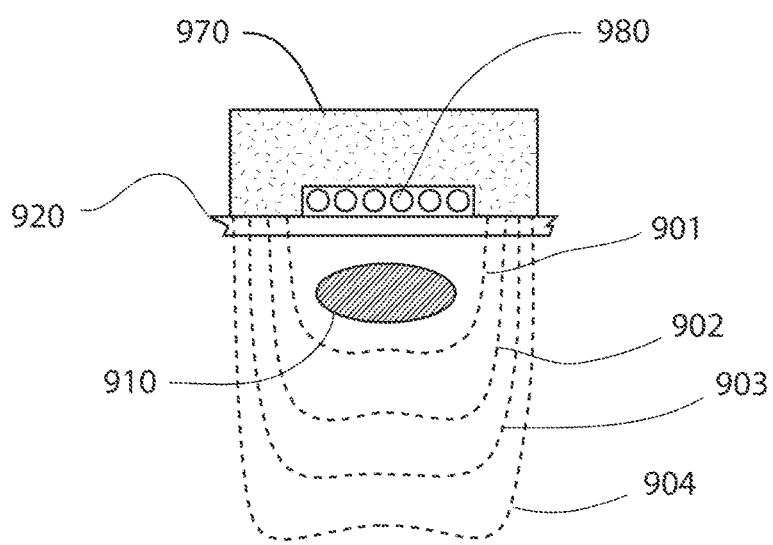
FIG. 9B shows magnetic field lines with an inverted U-shaped magnetic focusing element over a flat coil segment.

Various advantages of using a plurality of antenna segments having relatively flat coil segments and magnetic flux concentrators can be further understood with reference to the simplified diagrams in FIGS. 9A and 9B. FIG. 9A shows magnetic field lines, 901-904 around a flat current carrying coil segment 980 where there is no magnetic flux concentrator. The magnetic field lines around this current carrying coil segment are relatively symmetric and, as illustrated, extend a substantial distance above and below the coil, and well beyond the lateral sides of the cell. Magnetic field lines produced in this type of configuration are relatively diffuse, and the magnetic field strength is relatively low in the region of space beneath the coil. A plasma current channel 910 sustained beneath a coil segment, such as shown with respect to FIG. 9A, is relatively weakly coupled to the coil (e.g. the inductive coupling coefficient is relatively small) and can be diffuse. Accordingly it is relatively difficult to obtain a localized plasma in this configuration.

The simplified diagram in FIG. 9B illustrates magnetic field lines for an antenna segment having an inverted U-shaped ferromagnetic magnetic flux concentrator 970 over its coil segment 980. A substantially permeable magnetic flux concentrator provides low magnetic path resistance (low magnetic reluctance) for magnetic flux lines within the concentrator medium. The upper portions of magnetic flux lines 901-904 with respect to FIG. 9B are drawn into the ferromagnetic concentrator medium where magnetic path resistance is low. Owing at least to this effect, the magnetic flux concentrator is operable to confine and/or focus magnetic flux lines 901, 902, 903, 904 produced by high frequency current in the coil segment. Since the magnetic flux emerge from the flux concentrator in a downward direction, they extending relatively deep into the space below the coil and provide a more intense field in this space relative to the diffuse spreading field lines surrounding the coil segment in FIG. 9A. Accordingly, a relatively more intense and localized plasma current channel 910 can be sustained below the chamber wall 920. Although various magnetic flux concentrator embodiments comprise an approximately inverted U-shape cross section over a coil segment, such as shown with respect to FIG. 9B, there are further embodiments. A magnetic concentrator can have a transverse cross section of magnetically permeable material that is generally concave in a direction facing a dielectric window and have three or more laterally disposed downward facing extremities. For example, a relatively linear antenna segment comprising a flux concentrator such as shown with respect to FIGS. 6, 7A, and 7B can have an E-core cross-section comprising three extremities operable to induce current in two distinct localized intense plasma channels 640 below the adjacent window in the chamber wall.

It has been found that an antenna segment comprising a magnetic flux concentrator can selectively activate plasma in a relatively localized portion of chamber volume adjacent the applicator (e.g. active plasma regions 325 with respect to FIG. 3C are localized below each elongated applicator 352, 358, 356, 354 and extend along a length "L" shown with respect to FIG. 3B). An RPS plasma sustained in this manner has been found to be highly stable, and the volume of powered active plasma can be increased in proportion to the surface area of the antenna segments covering dielectric windows (e.g. the volume of active plasma can increase both in proportion to a dimension of an antenna segment and the number of antenna segments used). Localization and stability of active plasma regions powered in this manner are believed to arise through the deposition of power directly into the active plasma channels by way of the highly focused and deeply penetrating radiofrequency magnetic flux emanating from the extremities of magnetic concentrators.

RPS embodiments with respect to FIGS. 3A-3C, can have an entire chamber wall 360 comprised of dielectric material. In such embodiments, any portion of the dielectric chamber wall can be a useful window to introduce high frequency magnetic flux lines from an antenna segment into the chamber, and to allow circulating magnetic field lines to emerge therefrom. However, there are applications where a chamber comprised of a conducting wall material, such as a metal wall is preferred for reasons of strength, resistance to fracture, chemical resistance, and/or others. In still further applications a wall can comprise a lossy dielectric material. Conductive material can shield high frequency field lines from entering and/or emerging from a chamber, while a lossy dielectric can attenuate a high frequency magnetic field and reduce efficiency. However structural and/or other benefits of conducting, metallic, and/or lossy wall material can be obtained by providing high frequency magnetic field lines to circulate through the chamber can obtained in combination with by providing suitable dielectric windows, such as disclosed in the following exemplary embodiment.

Figure 8A:
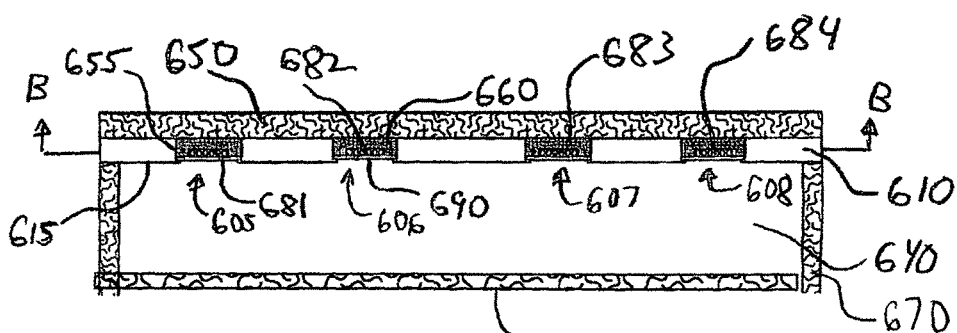
FIG. 8A shows a cross sectional view of a scalable plasma source chamber with metallic walls and an applicator over dielectric windows on a wall.
Figure 8B:
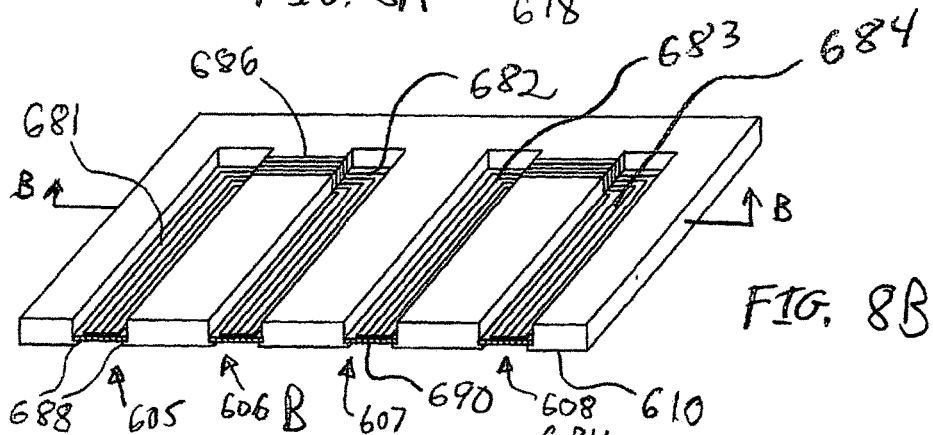
FIG. 8B is a simplified perspective view of the plasma source in FIG. 8A showing a portion of the upper chamber wall in FIG. 8A without an external outer wall layer.
Figure 8C:
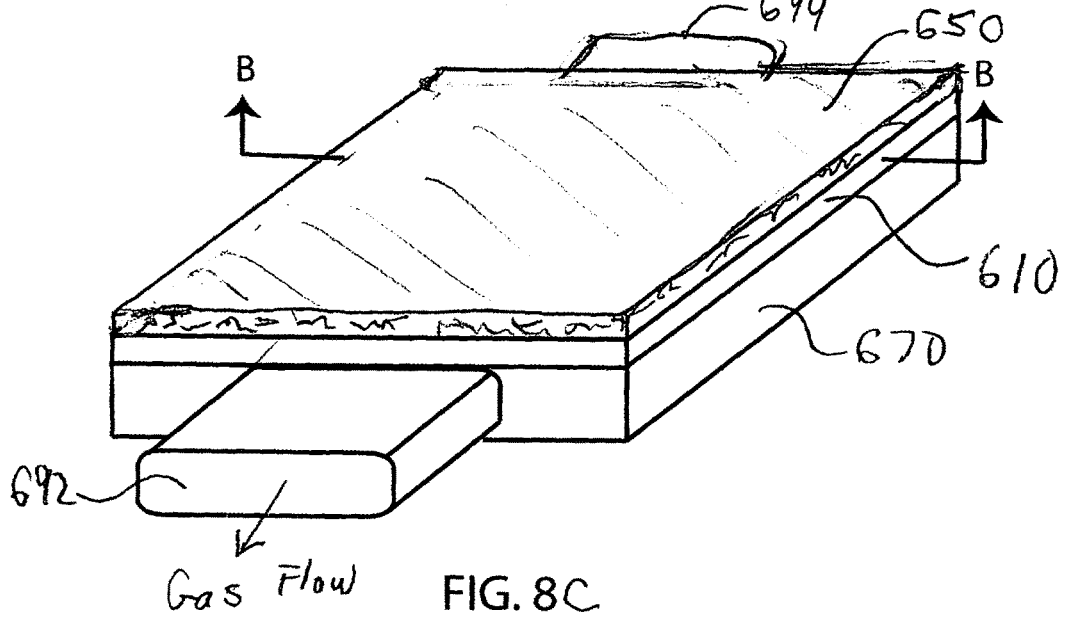
FIG. 8C is another simplified perspective view of the plasma source in FIG. 8A showing a process gas inlet, an outlet flow channel, and upper and side portions of the chamber

A further inductively coupled RPS linear plasma source embodiment having metal walls can be understood with respect to FIGS. 8A-8C. The chamber embodiment has a rectangular cross section shown in FIG. 8A, and upper source chamber wall 610 is comprised of a metal. Side chamber walls 670, and a lower chamber wall 678 can also be made from a metal. In some embodiments there can be an external outer wall layer 650 covering the upper chamber wall 610 and antenna segments 605, 606, 607, 608 configured thereon. The outer wall layer can also be comprised of metal and/or it can be a dielectric. It can be a protective layer for the antenna segments, provide structure/mechanical support, and/or have ornamental function.

FIG. 8B has another view of the upper chamber wall 610. FIG. 8C is a greatly simplified perspective view of the rectangular RPS chamber showing inlet 694 through which a process gas can be admitted to the RPS chamber. FIG. 8C also shows an outlet flow channel 692 through which species produced in the chamber can be transported for processing an article.

The upper applicator wall 610 includes a plurality of slots 655 operable to receive dielectric strip windows 690 and applicator antenna segments. Each antenna segment comprises a magnetic flux concentrator 660 and a linear flat coil segment 680 comprising generally parallel conductors. Furthermore, each antenna segment is generally associated with one dielectric strip window.

The dielectric strip windows 690 shown in FIG. 8A-8B can be supported on lips 688 abutting the inner surface of the applicator wall 610. In various embodiments, the dielectric strip windows can be relatively thin. Relatively thin windows can improve plasma localization and power coupling efficiency. In some embodiments a dielectric window can have a thickness of 10 mm or more, however a window thickness of 5 mm is preferable, and a thickness in the range of 2 mm-3 mm can be still more preferable, depending on the application.

A plasma feed gas can comprise a gaseous source of oxygen (i.e. $O_2$, $H_2O$, $H_2O_2$, hydrogen (i.e. $H_2$, $H_2O$, $H_2O_2$, $NH_3$, etc.), fluorine (e.g. $F_2$, $NF_3$, $SF_6$, $ClF_3$, a volatile fluorinated halocarbon in combination with an oxygen source, and others), carbon (i.e. various organic compounds), silicon (i.e. silanes, organo-silanes, organosilicates), and/or others, depending on the application. For example, various fluorine source chemistries, oxygen source chemistries, and/or hydrogen source chemistries such as disclosed above can be activated in an RPS plasma discharge to provide active species operable for surface cleaning, surface activation, and/or other treatments. Feed gas comprising a carbon and/or silicon source are useful for plasma chemical vapor deposition of carbon-containing and/or silicon-containing layers such as thick films, thin films, and/or monolayers on a surface. In applications such as plasma cleaning and deposition, a remote plasma discharge may preferably operate in a pressure range between approximately 0.05 Torr and 30 Torr (~6.5 Pa-4000 Pa), although pressures up to approximately 100 Torr, and pressures below 0.05 Torr can useful for plasma cleaning and deposition. For plasma excitation of a gas discharge laser, such as carbon dioxide and/or ion lasers, the pressure can be in the range of a fraction of a millitorr to tens of Torr (e.g. ~0.1 Pa to ~50 Pa), For ion and electron sources, pressures in the range of approximately 1 mTorr-10 mTorr are preferred, although a pressure in the range of about 0.01 mTorr to tens of milliTorr can be useful for various ion and/or electron source applications.

The magnetic flux concentrators 660 in each antenna segment 605, 606, 607, 608 (FIGS. 8A-8C) can be an inverted U-cross section as shown. With respect to the perspective view in FIG. 8B, there can be interconnections 686 between the conductors of respective coil segments 680 in adjacent antenna segments 681 and 681, and 683 and 684.

In various embodiments, antenna segments can be connected and/or powered in different ways. For example, the respective coil conductor ends of the serially connected coil segments of an antenna segment pair such as antenna segments 681 and 682, and of 683 and 684, can connected to the terminals of a single RF power source in parallel. Alternatively, a distinct power source can selectively power each serial group of connected antennas (e.g. antenna coil segments in a serial group are electrically connected in series) and/or antenna segments individually. Accordingly, power can be selectively and independently delivered to a serial, parallel, and/or serial-parallel group of antenna segments, and/or the relative phase of the power delivered to different serial, parallel, and/or serial-parallel group can be selectively adjusted to optimize plasma species uniformity. Conventional resonant and/or non-resonant power splitters and phase adjustment networks are useful to selectively deliver and/or control the amount of power, and/or the relative phase of power delivered to the various antenna segments and/or variously electrically connected groups of groups of antenna segments (there are two groups of two antenna segments shown in FIG. 8B, however further embodiments can have more a greater or smaller number of antenna segments on the same and/or different walls of an RPS chamber).

With respect to FIGS. 3A-3C, various inductive applicator embodiments comprise four relatively linear equal length antenna segments, each having three conductors. However, the number of antenna segments 352, 354, 356, 358 on a wall, the shape of an antenna segment, and/or the number of parallel conductors in any segment are not limiting. In further embodiments, an inductive applicator can have a smaller or greater number antenna segments, and a coil segment in one or more antenna segments can have a smaller or larger number of conductors. Furthermore, the various antenna segments can have different lengths, and antenna segments and/or a coil segment in an antenna segment can be non-linear, depending on the application. Although all of the antenna segments shown with respect to FIGS. 3A-3C are electrically connected in series, in further embodiments various antenna segments can be electrically connected in parallel and/or series-parallel.

In still further embodiments, a plurality of independent applicators can be used to transfer power into a plasma. In some embodiments, an applicator is energized with RF power essentially of a single frequency, although there are also embodiments where the energizing RF power can include a plurality of component frequencies. In alternative embodiments, different applicators can be energized selectively to couple different distinct amounts power from each applicator into the same plasma. The different applicators can couple power having respectively different frequency components into the plasma (e.g. each of the applicators can be independently powered using single frequency and/or multiple radiofrequency frequency power sources; and/or the power sources can be pulse, amplitude, frequency, and/or phase, and phase modulated). Furthermore, each of the various applicators can be powered in a selected phase relationship with respect to one another. Various forms of amplitude modulation are useful to control the type and distribution of active species produced in and/or emanating from various embodiments. Furthermore, a form and/or mode of power delivery can be useful to optimize uniformity, improve isolation between an RPS and a processing chamber receiving species therefrom, increase efficiency, and control various further aspects of a plasma treatment, depending on the application.

A cross sectional view of another remote plasma source embodiment can be understood with respect to FIG. 4. The embodiment has an inductive applicator comprising four antenna segments. Each of the antenna segments has U-shaped ferromagnetic focusing elements and parallel conductors in a coil segment. The antenna segments are disposed equidistant around the chamber periphery and each segment is operable to power an active plasma channel 540. In further embodiments a greater or smaller number of antenna segments can be used and they can be disposed on the chamber wall in other ways.

A linear plasma source herein disclosed can have heat exchange means (not shown) in thermal contact with the ferromagnetic elements and/or the chamber to remove heat. Some embodiments have thermally conductive cooling elements disposed adjacent to the focusing elements (in thermal contact thereto) and there are embodiments comprising fluid channels operable to circulate a liquid coolant. The fluid channels, heat pipes, and/or other heat transfer means can be disposed adjacent to the focusing elements (in thermal contact thereto), and/or can be embedded within the magnetic focusing elements. An applicator can also be configured for direct conductive and/or convective heat exchange from various coil segments. For example, the conductors in a coil segment can be tubing having coolant fluid flowing therein.

Another remote linear plasma source embodiment is shown with respect to FIG. 4. In this configuration an applicator has a composite magnetic flux concentrator 520 comprised of permeable ferromagnetic material encircling a tubular dielectric chamber 560. The composite flux concentrator 520 can be viewed as being comprised of a plurality of four individual discrete magnetic flux concentrator elements, each having a transverse cross section of magnetically permeable material generally concave in a direction facing the dielectric window, and having laterally disposed extremities extending toward the chamber at either side of the respective concave cavity in the cross section. Here, each of the lateral extremities at either side of a coil segment within the cavity is joined to the lateral extremity of an adjacent magnetic flux concentrator element by a continuous sector of the permeable material. Each discrete magnetic flux concentrator is operable to circulate focused magnetic flux through the chamber through a dielectric window 560. The circulating radiofrequency magnetic flux can surround a localized plasma current channel 540 and provide an electromotive force powering the current. The magnetic field lines associated with each concentrator element surround the interior coil segment and follow paths similar to the field lines 901-904 shown with respect to FIG. 9B.

Figure 5A:
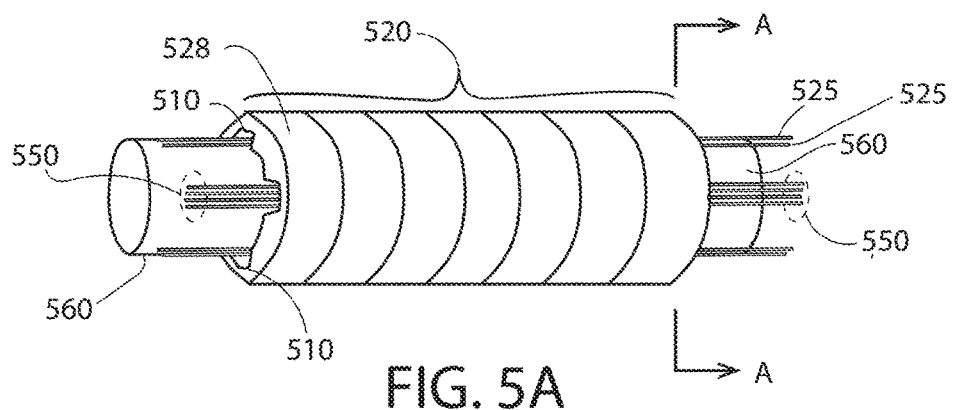
FIG. 5A shows a simplified transverse view of a further RPS having a focus element assembly comprised of generally toroidal elements.
Figure 5B:
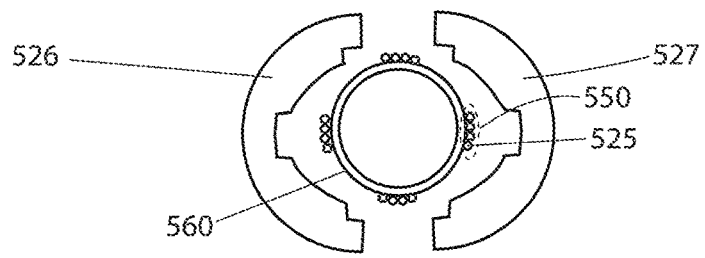
FIG. 5B is a side view of an RPS according to FIG. 5A showing a focus element assembly comprised of half-circular segments.

In various embodiments with respect to FIG. 4, an elongated ferromagnetic focusing structure 520 can be a unitary tubular structure comprising a ferromagnetic material. In further embodiments as shown with respect to FIG. 5A, a focusing structure 520 it can be assembled from a plurality of short annual, generally toroidal elements 528 disposed adjacently around the tubular chamber 560. The elements can include inverted U cross sections 510 that can be disposed over the axial coil segments 550 comprising coil conductor 525. Alternatively, as shown with respect to FIG. 5B, elongated "half circular" segments 526, 527 can be fitted together pairwise to form the elongated tubular magnetic focusing structure 520 over coil conductors 525 in coil segments 550, and tube 560. In further embodiments, different and/or further segmentation schemes are operable.

Figure 6:
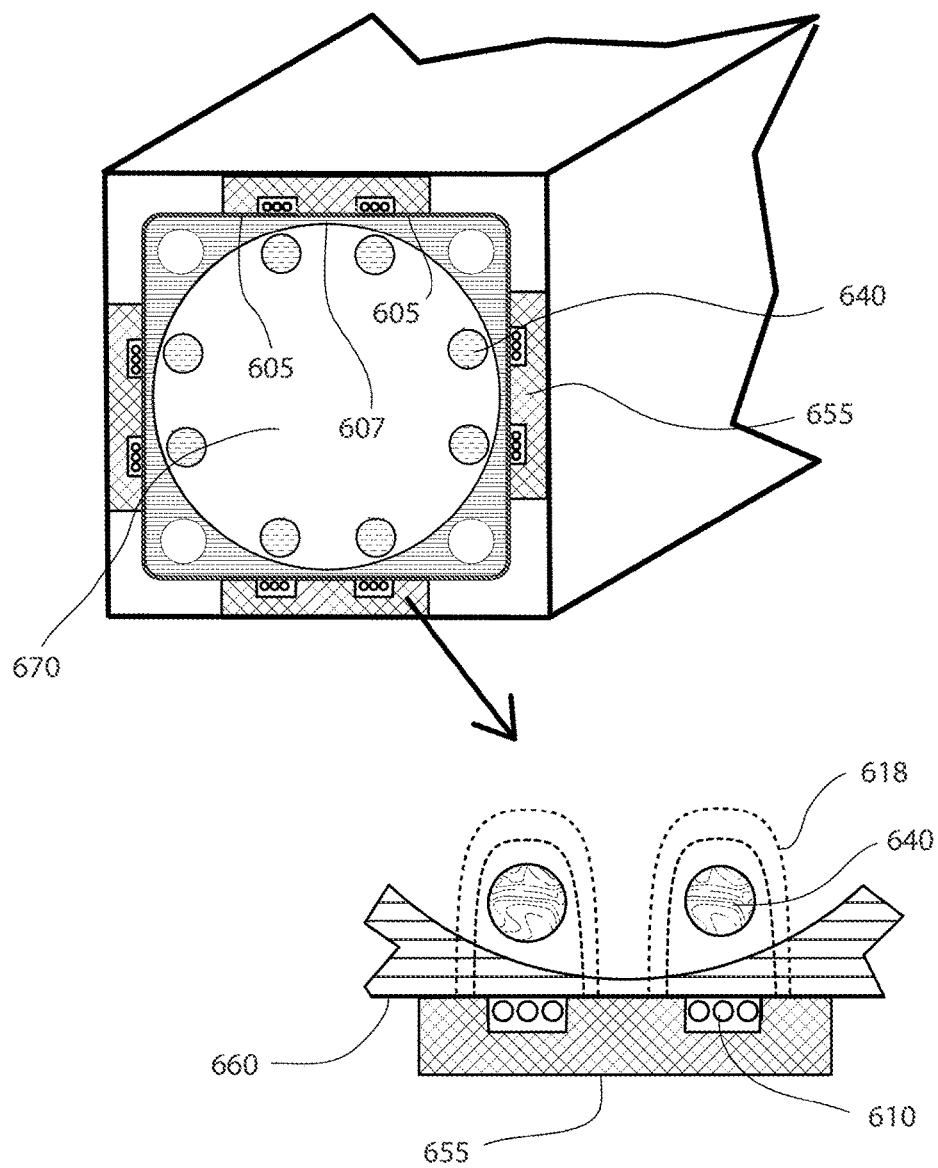
FIG. 6 shows. a simplified transverse view of a scalable plasma source having E-core focusing elements.
Figure 7A:
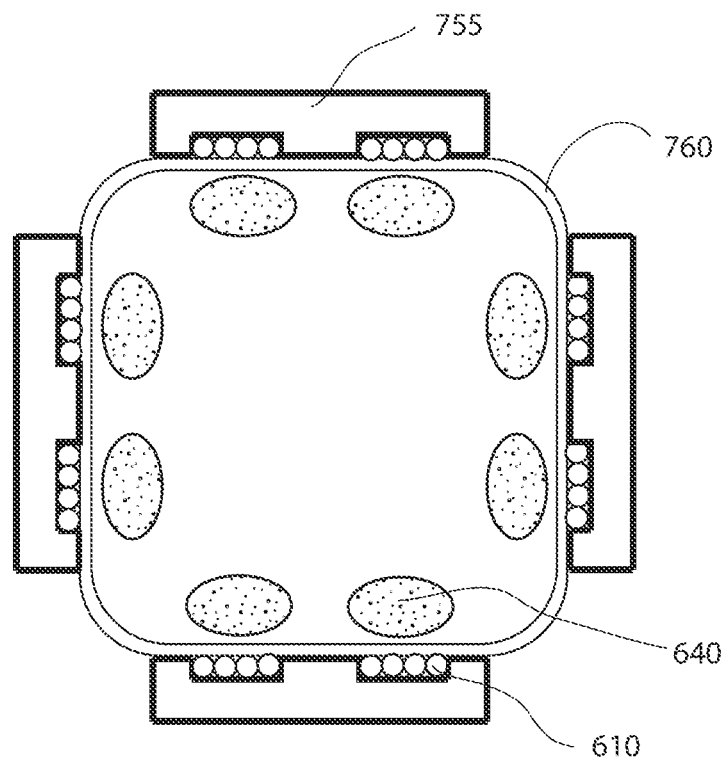
FIG. 7A is a simplified transverse view of a scalable plasma source embodiment including E core focusing elements and a generally rectangular chamber comprising dielectric walls.
Figure 7B:
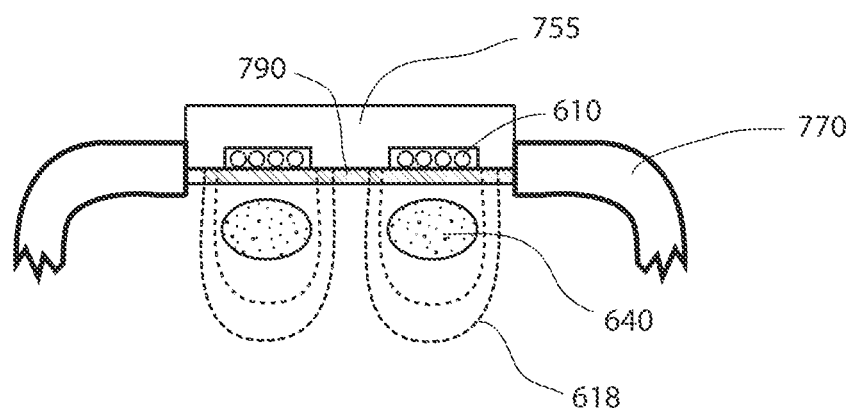
FIG. 7B is a simplified partial view showing a portion of a scalable plasma source embodiment having E core focusing elements and a generally rectangular chamber having a metallic walls comprising dielectric window portions.

Still further embodiments are disclosed in FIG. 6 and FIGS. 7A-7B. An antenna segment can have magnetic focusing elements comprised of permeable ferromagnetic material in the form of an E-core 655. High frequency magnetic flux lines 618 powered by rf current flow in a coil segment 610 can be directed into chamber 670 from leg 605 of an E-core, penetrate deeply into the chamber, and return to the center leg 607 of the core. The rf magnetic flux circulating from a leg of the E-core is operable to sustain a plasma channel 640. As shown with respect to FIG. 6, each E-core can sustain two plasma channels by flux lines emanating from each of the two legs.

According to the explanation, an E-core can equivalently be considered to be comprised of two inverted U-shaped cores in tandem. That is, the central chamber-facing extremity of the "E" can be viewed as a composite magnetic flux concentrator comprised of U-shaped cores wherein a lateral extremity of each core is joined to a lateral extremity of the other by permeable material. Accordingly, an E-core antenna segment has similar function and field lines as two adjacent U-core antenna segments stacked together in mutual contact to form an "E", with respective coil segments powered in a like manner (e.g. the coil segments being powered in the same phase relationship shown in FIGS. 3A-3B with respect to one another provide magnetic flux lines emanating from the outside legs 607 and return returning to the center "stacked together" leg 607 of the E-core).

An embodiment with respect to FIG. 7A comprises a rectangular dielectric chamber. In various embodiments, wall 760 can be a dielectric operable to be a window for magnetic flux emanating from E-cores 755. There are further embodiments, such as shown with respect the section in FIG. 7B, having a metallic wall 770 comprising dielectric window portions 775.

Figure 13A:
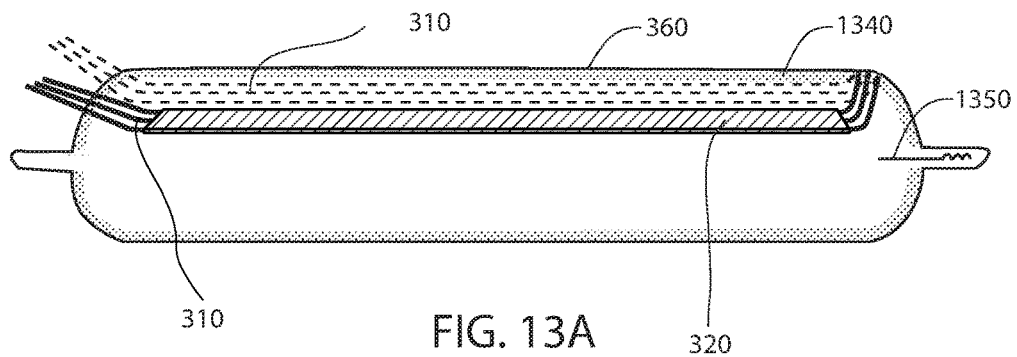
FIG. 13A is a simplified diagram showing a gas discharge lamp embodiment.

Although the disclosed apparatus is useful for remote plasma processing, there are embodiments where active species produced with a plurality of distinct intense plasma current channels are useful in other ways. For example, active species formed produced with a plurality of intense plasma channels according to the present disclosure the can be useful in a light source to emit visible and/or ultraviolet light (e.g. the plasma linear source can be useful to provide light). FIG. 13A is a simplified drawing showing a fluorescent lamp embodiment. With respect to FIG. 13A, a phosphor coating 1340 can absorb ultraviolet light produced from intense plasma current channels beneath antenna segments 310 and emit visible light through a transparent chamber wall 360. In some embodiments, the fluorescent lamp can have an atmosphere comprising mercury and a noble gas. The mercury can be in an elemental metallic or vapor form, and/or it can be in the form of a composition such as a metallic wire 1350 comprising amalgam of mercury (for example, a bismuth amalgram). During operation, an amalgam can be heated to a selected temperature in range of 70-90° C. and provide a mercury vapor partial pressure in the range of 5-10 mTorr to the chamber.

Figure 13B:
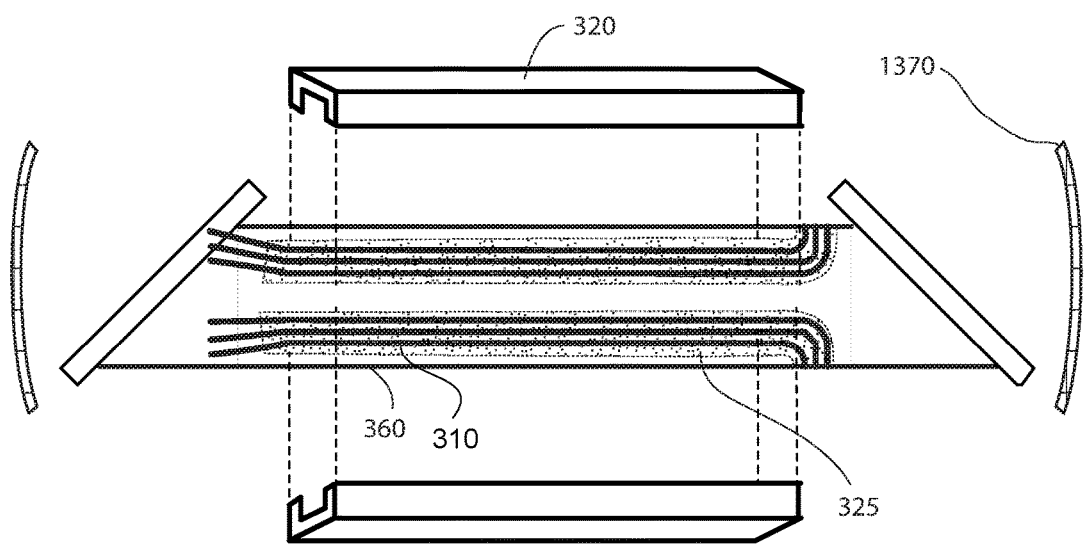
FIG. 13B is a simplified diagram showing a gas discharge laser embodiment.

In yet another embodiment with respect to FIG. 13B, a plurality of intense plasma current channels can excite a gaseous medium operable to provide a powerful laser beam. In FIGS. 13A and 13B, Antenna segment elements 310 and dielectric wall 360 perform as described in connection with FIGS. 3A-3C above. The distinct intense plasma current channels 325, power the plasma medium and create excited states that lase in a cavity defined by opposing transparent end of the chamber and mirrors 1370.

Figure 10A:
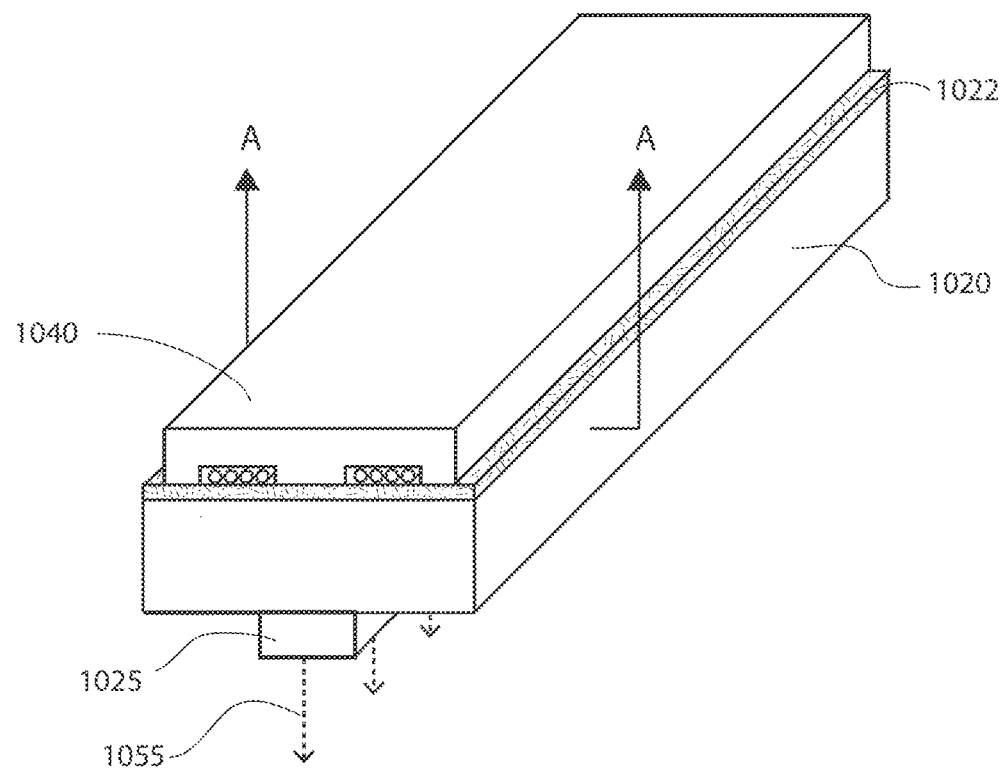
FIG. 10A is a simplified perspective external view of a plasma ion source.
Figure 10B:
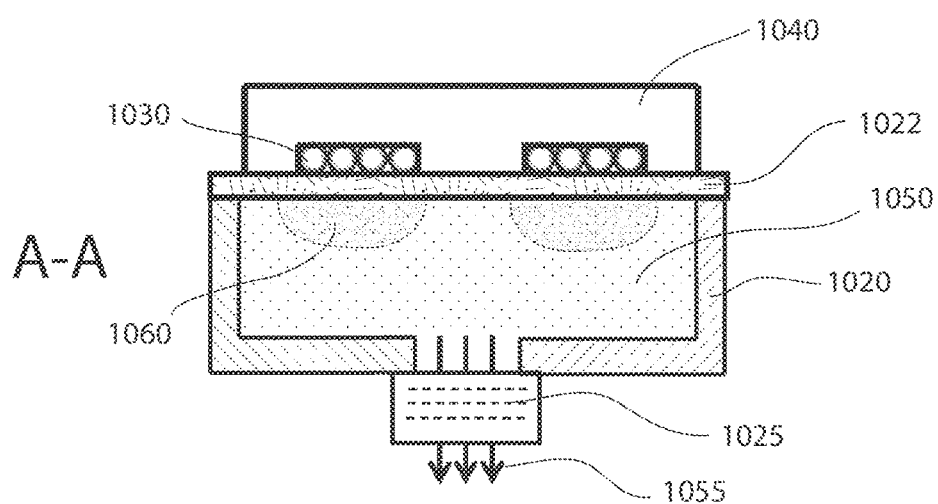
FIG. 10B shows a simplified cross sectional view of a source with respect to FIG. 10A.

In still further embodiments, a plasma source with respect to the present disclosure can useful for ion, electron, or neutral beam sources. Various embodiments useful in an ion source can comprise an electrically conductive chamber having a dielectric window on at least one wall of a linear plasma source chamber as shown with respect to FIGS. 10A-10B. FIG. 10A is a simplified perspective external view of a plasma ion source embodiment. FIG. 10B shows a simplified cross section A-A having an antenna segment adjacent to a top dielectric window 1022. The antenna segment comprises a magnetic flux concentrator 1040 covering coil segments 1030. High frequency magnetic flux emanating from one leg of the magnetic flux concentrator can enter the chamber 1020 through an adjacent dielectric chamber window. The flux can circulate through the chamber and return from the chamber, through the dielectric window, to another leg of the magnetic flux concentrator providing distinct intense plasma current channels 1060 powering a plasma 1050. As also shown with respect to FIG. 10B, the apparatus can have an ion extracting and accelerating 1025 for extracting ion beam 1055 from plasma 1050.

Figure 11:
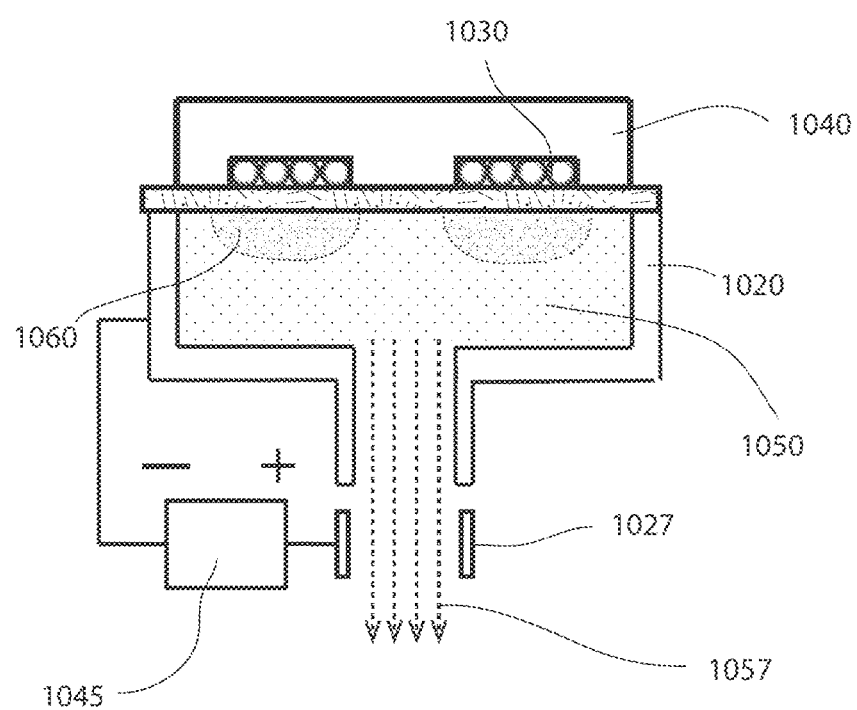
FIG. 11 is a simplified view of an electron source embodiment.

An embodiment operable as a linear electron source can be understood with respect to the simplified cross-sectional view of FIG. 11 (equivalent numerals are as described with respect to FIGS. 10A-10B. In a number of embodiments, an electron source comprises an elongated metal plasma generation chamber 1020, having an appearance substantially similar to the ion source shown with respect to FIG. 10A. The electron source can have an electron accelerating electrode 1027 and a direct current (DC) and/or pulsable voltage source 1045. A negative terminal of the DC voltage source 1045 can be connected to a metal chamber wall 1020, and the positive terminal of the source can be configured to maintain the electron accelerating electrode at a predetermined positive voltage relative to the metal wall. The positive accelerating electrode potential can extract and/or accelerate electrons 1057 from the plasma source in an electron beam.

Configurations generally similar to those shown with respect to FIGS. 10A-10B and FIG. 11 can also be a useful accelerated neutral plasma beam source. A neutral beam can be provided by powering the extraction and/or acceleration electrodes by a radiofrequency voltage in place of the direct current power/bias voltage sources (e.g. 1045 in FIG. 11) described above. In some embodiments, a single common radiofrequency source can be used to power both the antenna segments and the extraction/acceleration electrodes.

In a lasing embodiment, an elongated plasma generation chamber according to the present disclosure can have suitable optical windows and/or mirrors aligned at opposing ends of the long axis. The mirrors can reflect light to traverse the chamber a predetermined number of times before emerging through a window in a laser beam. Active plasma generated with antenna segments disclosed herein can produce excited states suitable to amplify a coherent beam of light by stimulated de-excitation to lower states. Accordingly, the plasma source can energize a relatively powerful visible, infrared or ultraviolet laser.

Figure 14A:
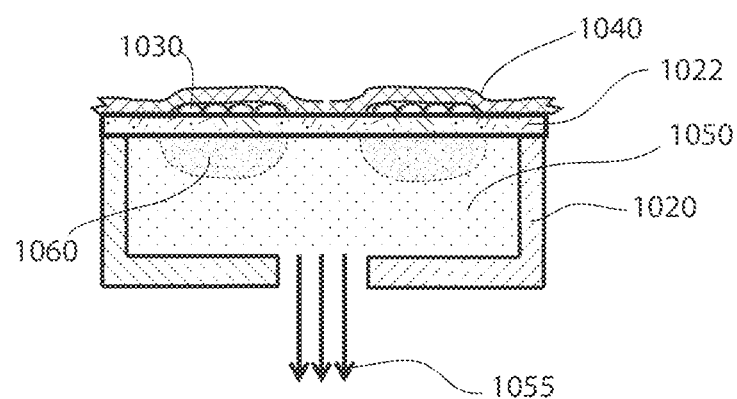
FIG. 14A shows linear plasma source comprising magnetic flux concentrators in a ferromagnetic layer.
Figure 14B:
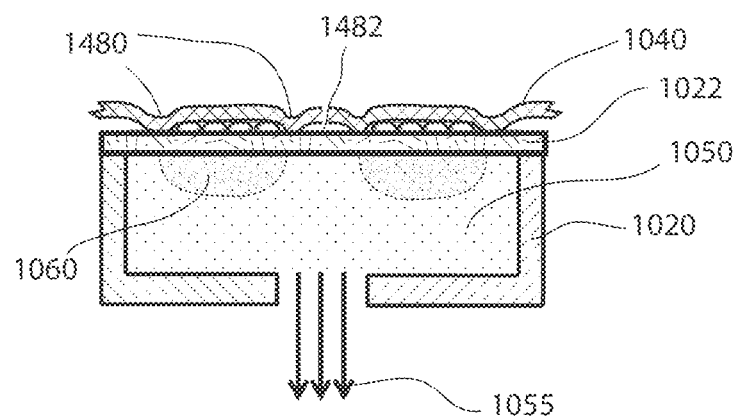
FIG. 14B shows another embodiment comprising magnetic flux concentrators in a ferromagnetic layer.
Figure 14C:
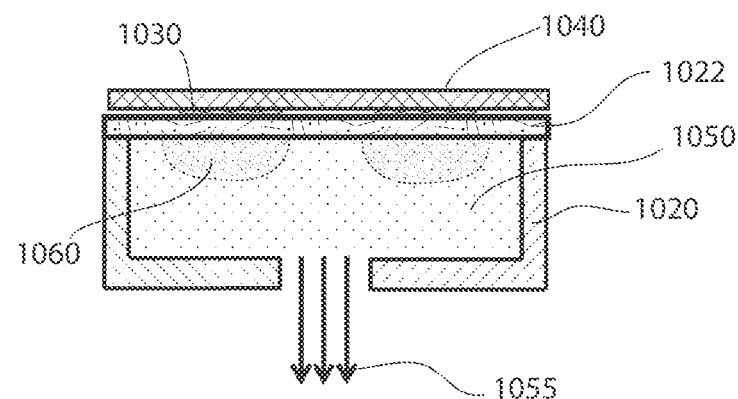
FIG. 14C shows an embodiment comprising focusing elements in plate-like ferromagnetic layer.

In still further embodiments, as shown with respect to the simplified diagrams in FIGS. 14A, 14B, 14C, a unitary continuous sheet or layer of ferromagnetic material 1040 is operable to perform as the magnetic focusing elements in a plurality of distinct antenna segments. In the embodiment shown with respect to FIG. 14A, a relatively flat coil 1030 can be covered by inverted U-shaped contours of the ferromagnetic overlayer 1040. With respect to FIG. 14B, gaps 1482 can be provided to further concentrate and direct the radiofrequency magnetic flux lines through the adjacent dielectric wall 1022. With respect to FIG. 14C, the ferromagnetic material can be plate-like. Here the coil segment conductors are in a thin layer to minimize the magnetic resistance for flux lines circulating within the ferromagnetic plate 1040 through dielectric window 1022 and around the intense plasma current channels 1060 in the chamber. In some embodiments, a ferromagnetic plate-like layer can be about 10 mm thick and the conductors of the coil segment can have a thickness of approximately 0.2 mm.

In the foregoing specification, various aspects are described with reference to specific embodiments, but those skilled in the art will recognize that further aspects are not limited thereto. Various features and aspects-described above may be used individually or jointly. Other aspects of the invention, including alternatives, modifications, permutations and equivalents of the embodiments described herein, will be apparent to those skilled in the art from consideration of the specification, study of the drawings, and practice of the various aspects. Further, various aspects can be utilized in any number of environments and applications beyond those described herein without departing from the broader spirit and scope of the description. The written description and accompanying drawings are, accordingly, to be regarded as illustrative rather than restrictive.

The embodiments and preferred features described above should be considered exemplary, therefore including all such alternatives, modifications, permutations and equivalents as fall within the true spirit and scope of the present disclosures.

What is claimed is:

1. A linear inductive plasma source operable to generate a plurality of discrete active plasma current channels to provide active species and/or electromagnetic radiation in a plasma source chamber;
   wherein:
   the linear inductive plasma source comprises the plasma source chamber and plasma source chamber includes a wall having one or more dielectric windows transparent to radio frequency magnetic flux and the plasma source further comprises an inductive applicator having a plurality of distinct elongated antenna segments, each antenna segment being disposed adjacent to an exterior surface of one of the one or more dielectric windows;
   each distinct elongated antenna segment comprises a distinct magnetic flux concentrator and a distinct coil segment consisting essentially of coil conductors disposed adjacent to the exterior surface of the respective dielectric window and aligned generally parallel to the longitudinal axis of the antenna segment; and
   the magnetic flux concentrator has a generally concave transverse cross section covering the coil conductors and facing the dielectric window, and has first and second laterally disposed extremities forming opposing sides of the transverse cross section, the extremities extending toward the chamber interior up to the exterior window surface;
   each distinct elongated antenna segment is operably configured to receive power from a radio frequency power source and induce circulating radio frequency magnetic flux lines emanating directionally from the first laterally disposed extremity of the magnetic flux concentrator through the adjacent dielectric window into the chamber, and returning directionally from the chamber through the adjacent dielectric window to the second lateral extremity of the magnetic flux concentrator; and
   the circulating magnetic flux lines induced by each distinct elongated antenna segment are operable to induce a respective distinct intense plasma current channel inside the chamber situated under the elongated antenna segment laterally between the first and second extremities of the magnetic flux concentrator, and proximate to the interior surface of the dielectric window under the magnetic flux concentrator, and the intense plasma current channel has a direction generally parallel to the longitudinal axis of the elongated antenna segment and to the adjacent dielectric window area, and has a direction perpendicular to the circulating magnetic flux lines;
   whereby the plurality of distinct intense plasma current channels are operable to maintain plasma in the plasma source chamber and emanate active species and/or electromagnetic radiation from the chamber.

2. The plasma source of claim 1 wherein all ends of the coil conductors at one longitudinal end of an elongated coil segment are connected to each other and all ends of the coil conductors at an opposite longitudinal end of an elongated coil segment are connected to each other.

3. The plasma source of claim 1 comprising first and second distinct longitudinally coextensive antenna segments comprising distinct respective first and second magnetic flux concentrators, each of the first and second magnetic flux concentrators having left and right laterally disposed extremities; wherein a right extremity of the first magnetic flux concentrator is conjoined to a left extremity of the second magnetic flux concentrator by ferromagnetic material, whereby magnetic flux lines emanating directionally from the left extremity of the left magnetic flux concentrator and from the right extremity of the right magnetic flux concentrator, circulate through the chamber, and return from the chamber to the conjoined extremities.

4. The plasma source of claim 3, further comprising ion extracting and accelerating structures, wherein the wall of the chamber comprises an electrically conductive material and the charged particles comprise ions.

5. The plasma source of claim 3 further comprising an electron accelerating electrode and a direct current voltage source operable to maintain the electron accelerating electrode at a positive potential relative to the plasma, wherein the wall of the chamber comprises electrically conductive material and the charged particles comprise electrons.

6. The plasma source of claim 1 further comprising an extracting and accelerating structure operable to extract charged particles from the plasma in a beam.

7. The plasma source of claim 1 further comprising two opposing optical windows in the wall of the chamber and at least two focusing mirrors, wherein the plasma in the chamber comprises an active laser medium and the plasma source is operable as a gas discharge laser.

8. The plasma source of claim 1, wherein the plasma is operable to produce light, the chamber comprises a highly transparent wall area operable to transmit the light, and the plasma source is operable as a gas discharge lamp.

9. The plasma source of claim 8 wherein the interior surface of the highly transparent wall area has a phosphor coating, the plasma is operable to produce ultraviolet light, and the phosphor coating is operable to absorb the ultraviolet light and emanate fluorescent light in a visible spectral region through the transparent wall area, whereby the plasma source is operable as a fluorescent lamp.

10. The plasma source of claim 9 wherein the interior of the chamber has a noble gas and mercury, and the chamber is sealed.

11. The plasma source of claim 10, wherein the interior of the chamber includes an amalgram of mercury operable to provide a mercury vapor partial pressure in the range of 5-10 mTorr to the chamber during operation and the plasma source is operable to heat the amalgram to a selected temperature in the range of 70-90° C.

12. The plasma source of claim 1 further comprising a treatment region spatially segregated from the plasma generation chamber, wherein the plasma source is operable treat an article disposed in the treatment region using a process depending on species emanating from the plasma generation chamber.

13. The plasma source of claim 1 comprising first and second adjacent elongated antenna segments wherein the coil conductors in the first and second antenna segments are generally parallel and coextensive in the longitudinal direction, and the coil conductors in the first and second antenna segments have left ends generally proximate to a left longitudinal position, and right ends generally proximate to a right longitudinal position, wherein the left ends of the coil conductors in the first antenna segment are electrically connected in parallel to a first terminal of a radiofrequency power source.

14. The plasma source of claim 13, wherein the left ends of the generally parallel coil conductors in the second antenna segment are electrically connected in parallel to a second terminal of the radiofrequency power source.

15. The plasma source of claim 13 wherein the right end of each generally parallel coil conductor in the first elongated antenna segment is electrically connected in series to a right end of a corresponding parallel coil conductor in the second elongated antenna segment.

16. The plasma source of claim 1 wherein each of the generally parallel coil conductors in each individual antenna segment is electrically connected in series to a generally parallel coil conductor in another antenna segment.

17. The plasma source of claim 1 wherein at least one antenna segment has a discrete magnetic flux concentrator.

18. A linear inductive plasma source operable to generate a plurality of intense active plasma current channels to sustain a plasma and produce active species and/or electromagnetic radiation in a plasma source chamber,
wherein:
the linear inductive plasma source comprises the plasma source chamber and the plasma source chamber includes a wall having one or more dielectric windows transparent to radio frequency magnetic flux and the plasma source comprises an inductive applicator having a plurality of distinct elongated antenna segments, each antenna segment being disposed adjacent to an exterior surface of a one of the one or more dielectric windows;
each distinct elongated antenna segment comprises a magnetic flux concentrator and generally parallel coil conductors,
each coil conductor in an antenna segment is disposed adjacent to the exterior surface of a dielectric window and aligned generally parallel to the longitudinal axis of the antenna segment, and
the magnetic flux concentrator has a generally concave transverse cross section covering the coil conductors and facing the dielectric window, and has first and second laterally disposed extremities forming opposing sides of the transverse cross section, the extremities extending toward the chamber interior up to the exterior window surface; and
wherein:
the plurality of distinct elongated antenna segments are electrically interconnected to receive radio frequency power from a radio frequency power source and induce radio frequency magnetic flux lines emanating directionally from a first extremity of each magnetic flux concentrator through the adjacent dielectric window, circulating through the chamber, and returning directionally from the chamber through the adjacent dielectric window to a second extremity of the magnetic flux concentrator;
the magnetic flux lines from each respective distinct antenna segment are operable to induce a distinct corresponding intense plasma current channel inside the chamber situated laterally between the first and second extremities of the magnetic flux concentrator and proximate to the inner surface of the dielectric window under the magnetic flux concentrator, and
the plasma current channel has a direction generally parallel to the longitudinal axis of the elongated antenna segment and to adjacent dielectric window surface under the respective antenna segment, and perpendicular to the circulating magnetic flux lines; whereby the active species and/or electromagnetic radiation can emanate from the plasma source chamber.

19. The plasma source of claim 18 comprising first and second adjacent elongated antenna segments wherein the coil conductors in the first and second antenna segments are generally parallel and coextensive in the longitudinal direction, the coil conductors having left ends generally proximate to a left longitudinal position, and right ends generally proximate to a right longitudinal position, wherein the left ends of the coil conductors in the first antenna segment are electrically connected in parallel to a first terminal of a radiofrequency power source, and the left ends of the coil conductors in the second antenna segment are electrically connected in parallel to a second terminal of the radiofrequency power source.

20. The plasma source of claim 19 wherein the right end of each coil conductor in the first elongated antenna segment is electrically connected in series to a right end of a corresponding parallel coil conductor in the second elongated antenna segment.

\* \* \* \* \*